United States Patent [19]

Nishizawa

[11] 4,364,072

[45] Dec. 14, 1982

[54] STATIC INDUCTION TYPE SEMICONDUCTOR DEVICE WITH MULTIPLE DOPED LAYERS FOR POTENTIAL MODIFICATION

[75] Inventor: Jun-ichi Nishizawa, Sendai, Japan

[73] Assignee: Zaidan Hojin Handotai Kenkyu Shinkokai, Sendai, Japan

[21] Appl. No.: 18,774

[22] Filed: Mar. 8, 1979

[30] Foreign Application Priority Data

| Mar. 17, 1978 [JP] | Japan | 53/31223 |
| Jan. 11, 1979 [JP] | Japan | 54/2378 |
| Jan. 24, 1979 [JP] | Japan | 54/7609 |

[51] Int. Cl.$^3$ .......................................... H01L 29/80
[52] U.S. Cl. ...................................... 357/22; 357/38; 357/55; 357/56
[58] Field of Search .................. 357/38, 22, 55, 56

[56] References Cited

U.S. PATENT DOCUMENTS

| 4,132,996 | 1/1979 | Baliga | 357/38 |
| 4,199,771 | 4/1980 | Nishizawa et al. | 357/22 |
| 4,216,029 | 8/1980 | Ohki | 357/22 |
| 4,216,038 | 8/1980 | Nishizawa et al. | 357/43 |
| 4,216,490 | 8/1980 | Ohki | 357/22 |
| 4,223,328 | 9/1980 | Terasawa et al. | 357/38 |

FOREIGN PATENT DOCUMENTS

| 2503800 | 8/1976 | Fed. Rep. of Germany | 357/22 |
| 2801085 | 7/1978 | Fed. Rep. of Germany | 357/22 |
| 50120420 | 4/1977 | Japan | 357/22 |
| 54-131881 | 10/1979 | Japan | 357/22 |

OTHER PUBLICATIONS

T. Demassa et al., "The Inhomogeneous Channel Fet: ICFET", S. S. Electr., vol. 16, #8, Aug. 1973, pp. 847–851.

*Primary Examiner*—Joseph E. Clawson, Jr.
*Attorney, Agent, or Firm*—Cushman, Darby & Cushman

[57] ABSTRACT

In a static induction type semiconductor device comprising a semiconductor region having one conductivity type and a low impurity concentration and gate regions having an opposite conductivity type and a high impurity concentration formed in the semiconductor region to thereby define a channel region between these gate regions, there is provided a subsidiary semiconductor region having the one conductivity type and a relatively high impurity concentration either around each gate region to leave an effective channel region in the semiconductor region, or adjacent to the effective channel region in the entire channel region on the drain side. By so constructing the device, this effective channel region has a relatively low potential difference even when the channel region is completely depleted, and provides a relatively wide current path. The subsidiary semiconductor regions establish a relatively high potential difference near the gate regions so that the distance between the gate regions can be made substantially small. In case the subsidiary semiconductor regions are provided around the gate regions, the built-in potential at the junction will become large so that, even at the time of forward biasing, the minority carrier injection from the gate to the channel will become small. Also, this composite channel structure can be effectively applied to recessed gate device and split gate device as well.

4 Claims, 34 Drawing Figures

STATIC INDUCTION TYPE SEMICONDUCTOR DEVICE WITH MULTIPLE DOPED LAYERS FOR POTENTIAL MODIFICATION

BACKGROUND OF THE INVENTION

1. Field of the Invention

The present invention relates to semiconductor device, and more particularly it pertains to semiconductor device having a source, a channel and a gate.

2. Description of the Prior Art

Known static induction transistor, as well as static induction type thyristor, devices have a structure similar to field effect transistor in that they have a source, a channel and a gate. However, these known transistors and thyristors are different from field effect transistor in that the former have a very small series resistance between the intrinsic gate which substantially controls the current from the source, and also in that the channel can be rendered pinched off only by the voltage between the gate and the source, which voltage including the built-in potential. In the pinched-off state of these static induction type transistor and static induction type thyristor devices, the potential profile between the gate regions has such configuration that the potential becomes progressively lower as it approaches the center of the channel from the gate region, and the potential becomes minimum at the center of the channel. When this potential is viewed in the direction of the main current flow, the potential increases progressively from the source, and via a maximum value, it gradually decreases. Accordingly, the potential distribution or profile exhibits a saddle shape within the channel region. When viewed in a section of the channel, the potential rises progressively as the portion of the channel goes toward the gate region from the saddle point. In this specification, the particular semiconductor region whereat the potential difference departing from the potential at the saddle point is able to become substantially to the value of thermal energy is called either an intrinsic gate region or an effective channel region. It is needless to say that the words "thermal energy" mean the energy at that temperature which is noted in the operative state of a semiconductor device, and that this energy is not one noted at the ambient temperature. Also, the term "the width of the effective channel" mean the dimensions of the effective channel region running in a direction perpendicular to the direction of current flow, and the term "the length of the effective channel region" mean the dimensions of said effective channel region running in the direction of current flow.

A junction static induction transistor comprises: a heavily-doped source region of a certain conductivity type; a heavily-doped drain region of said certain conductivity type; a lightly-doped channel region of said certain conductivity type disposed between said source and drain regions for allowing charge carriers to flow from said source region to said drain region through said channel region; a heavily-doped gate region of a conductivity type opposite to said certain conductivity type formed adjacent to said channel region for developing a depletion layer into said channel region and capable of pinching-off said channel region by the depletion layer. That portion of the channel region at which the flow of charge carriers is controlled substantially by the potential thereat (i.e. the saddle point of the gate-to-gate potential profile) is called the intrinsic gate region which almost coincides with the effective channel region. The resistance of the region(s) from said source region to said intrinsic gate region inclusive, i.e. the series resistance which develops negative feedback action, is made less than $1/G_m$ at least in the low drain current operational region where $G_m$ represents the true transconductance of the transistor. The small series resistance means that the static induction transistor has a short channel structure. If the channel is made wide, this is effective in reducing said series resistance, but the surface area of the device will inevitably become large. Depending on purposes, various types of gate structures have been proposed including an insulated gate structure as is employed in insulated or metal-insulator-semiconductor gate field effect transistor, and a Schottky or metal-semiconductor gate structure.

The static induction type thyristor has been formed basically by substituting the drain region of said certain conductivity type by a semiconductor region of a conductivity type opposite to said certain conductivity type in said transistor structure to form a diode structure.

A static induction transistor (SIT), in principle, is a transistor which has a very small series (negative feedback) resistance within that channel region, and which is able to form a potential barrier within the current path. Control of this potential barrier is effected by a gate voltage and a voltage of one of the main current terminals (in the case of transistor, it is drain). Accordingly, so long as a potential barrier is present within the channel at the operative state of the transistor, and so long as it is possible to approximate as infinite the carrier density of the semiconductor region on the source side of this barrier, the drain current, basically, will increase exponentially relative to an increase in the gate voltage (including a decrease in the reverse gate voltage) and the drain voltage.

As a result of subsequent research and developments, there has been materialized such a device which effectively utilizes the minority carrier injection from the gate region by forwardly biasing this gate region. This effective utilization means increasing the drain current. More particularly, by injecting minority carriers from the gate region into the channel region located close to the source region by the use of a short channel structure having a small series resistance, it is possible to have the device pull down the height of the potential barrier and also attract of majority carriers from the source region. As the amount of those carriers taken out from the source approaches the limit, the device will begin to exhibit a saturating type characteristic similar to that of a bipolar transistor.

In order to effectively control the potential of the intrinsic gate, it is necessary to make the ratio $\eta$ of variation of the potential of the intrinsic gate relative to the variation of the gate potential as great as possible, i.e. the potential of the intrinsic gate be changed by the gate potential as faithful as possible. To this end, it is preferable that the distance between the source region and the intrinsic gate be great. In order to effectively utilize minority carrier injection in forward bias mode, however, it is not desirable to provide a great distance between the source region and the intrinsic gate.

In such known static induction transistors, the width of the overall channel region constitutes an important factor which governs both the negative feedback resistance and the maximum permissible current value. Basically speaking, however, this width has been determined in the past by the impurity concentration of the channel region and also by the gate voltage employed. For example, in a junction gate device, the built in junction potential between the gate region and the channel region is determined by the respective impurity concentrations of these two regions. If the channel has a width almost equal to or greater than the width of the depletion layer developed by the built-in potential at the junction, such device is intended mainly for use in the so-called depletion mode of normally-on type operation. On the other hand, if the channel width is less than the width of the depletion layer, the device is intended mainly for use in the so-called enhancement mode of normally-off type operation, and is rendered conductive by by the application of a forward voltage to the gate electrode.

An increase in the width of the effective channel, substantially through which current flows, may be achieved if the impurity concentration of the overall channel region is lowered and if the distance between the gates is enlarged. In order to obtain a large current, in view of restrictions from the viewpoint of the manufacturing techniques and the rise in temperature, a multi-channel structure is often adapted. However, even in such a multi-channel structure, the situation or circumstance is the same if each of such channels is considered independently of each other.

For the purpose of elevating packing density, it is desirable to make the gate-to-gate distance small. Such an attempt, however, requires elevation of the impurity concentration of the channel region, and the width of the effective channel region will become small. Where the impurity concentration of the channel region is high, it becomes neccessary to make the width of the channel region in the direction perpendicular to the direction of current flow small in order to achieve pinch-off state. Accordingly, the series resistance will become large, and the gate capacitance will become large also. Thus, these factors will constitute a cause for limiting high-speed operation or high-frequency operation.

Another cause of limiting the high frequency characteristic of SIT is in the potential distribution or profile near the intrinsic gate. More particularly, in the vicinity of the intrinsic gate, the potential gradient in the direction of current flow is gentle, and therefore, the speed of travel of electrons will become small. If, however, the length of the channel region is made as small as possible, this will result in enhancing the high frequency characteristic. Also, in order to increase the gate voltage efficiency $\eta$, it is effective to a certain extent to separate the positions of the source and the intrinsic gate apart from each other. If, however, the distance between the high impurity concentration source region and the intrinsic gate is excessively great, the number of those majority carriers injected from the source region into the intrinsic gate, as well as the proportion of those minority carriers which are injected from the gate region into the channel region, which reach the vicinity of the source region will decrease, and accordingly the drain current $I_d$ will decrease. Therefore, the transconductance $g_m = dI_D/dV_G$ will cease to elevate so much, and the resistance at the time of conduction inconveniently will become great.

As stated above, the width of the channel region is determined by its impurity concentration of this region, and furthermore the distance between the source region and the intrinsic gate cannot be made very long. Accordingly, the gate voltage efficiency $\eta$ has, in the past, been about 0.5 or smaller in known practical static induction type devices.

A static induction type thyristor, representing an application of the principle of the known static induction type transistor, is basically arranged with a channel structure and a gate structure similar to those of static induction type transistor, provided within at least one region of a pn (more correctly, pin or p$\pi$n or p$\mu$n) diode. Such thyristor exhibits a characteristic which may be called that of a gated diode. In contrast thereto, conventional pnpn thyristor may be interpreted as a composite structure of a pnp transistor and an npn transistor which positively feedback to each other. The static induction type thyristor may, on the other hand, be interpreted as a composite structure of a static induction type transistor and a diode. The known pnpn thyristor and said static induction type thyristor are same in that the main current is formed with carriers of both polarities. However, the principles of the operation mechanisms of the conventional thyristor and the gated diode (static induction type thyristor) are different from each other.

Static induction type thyristor has the advantages represented by high input impedance, high-speed, large current operation similar to static induction type transistor. However, its ability still leaves a great possibility to be improved.

SUMMARY OF THE INVENTION

The object of the present invention is to provide a static induction type semiconductor device having an improved channel structure and especially suitable for high-speed and/or large current operation.

According to an embodiment of the present invention, there is provided, surrounded by a gate region(s) of one conductivity type, a channel region of a second conductivity type, and the impurity concentration of the central portion of this channel region is so set as to be lower than that of the outer side portions (see FIG. 7A). In this structure, the amount of ionizable charge is small in the central portion of the channel region where the impurity concentration is low. Therefore, when the channel region is depleted, this channel portion exhibits a relatively flat potential profile. In those portions of the channel region located close to the gate regions, the amount of ionizable charge is great, so that such portions, when depleted, present a relatively steep potential profile. Accordingly, there is obtained an effective channel region having an increased width for the transportation of electric charge from one of the main electrodes to another which is controlled by the potential barrier formed by a depletion layer. For this reason, when considered from the width of the effective channel region, there is achieved small gate spacing, whereas when considered from the aspect of gate-to-gate distance, the width of the effective channel region can be expanded, and hence the maximum permissible current can be enlarged. Accordingly, it is possible to improve the true transconductance $G_m$, the efficiency of gate voltage $\eta$, the voltage amplification factor $\mu$, and the series resistance $R_s$.

According to another embodiment of the present invention, there is provided a region having a relatively high impurity concentration at a site adjacent to and downstream of, in the direction of the main current, a relatively low impurity concentration region which constitutes the effective channel region (see FIG. 9A). In this region, the potential gradient in the direction of current flow becomes steep (see FIG. 9B). Therefore, carriers move quickly, and the transit time of carriers decreases. By the provision of this region, it is possible also to shorten the length (in the direction of current flow) of the effective channel region. Also, the potential profile within the low impurity concentration region also is subjected to the influence of the potential profile of the region having a higher impurity concentration, and is naturally modified to give a wider effective channel width.

These and other objects, the features as well as the advantages of the present invention will become apparent from the following detailed explanation when taken in conjunction with the accompanying drawings.

BRIEF DESCRIPTION OF THE DRAWINGS

Like symbols and reference numerals indicate like parts throughout the drawings.

DETAILED DESCRIPTION OF THE PREFERRED EMBODIMENTS

The present invention represents an improvement of the channel region structure in static induction type semiconductor device, and is applicable equally effectively to transistor, thyristor and like devices. Accordingly, unless otherwise stated, similar structure can be employed in transistor as well as thyristor. In the instance of thyristor, it can be said basically that the drain region of a transistor is substituted by a semiconductor region having a conductivity type opposite to that of the channel region. There are instances wherein the source region may be called one of the main electrode regions, and the drain region or the aforesaid semiconductor region of the opposite conductivity type is called the other main electrode region. Also, a part of the channel region adjacent to said the other main electrode region may be called a quasi drain region.

Prior to describing the examples of the present invention, the basic principles of the present invention will be explained to make the interpretation and understanding of the present invention easy.

Firstly, taking up an example of the "step (or abrupt) junction", explanation will be made with respect to potential profile or distribution within a depletion layer.

Figures 1A, 2A:
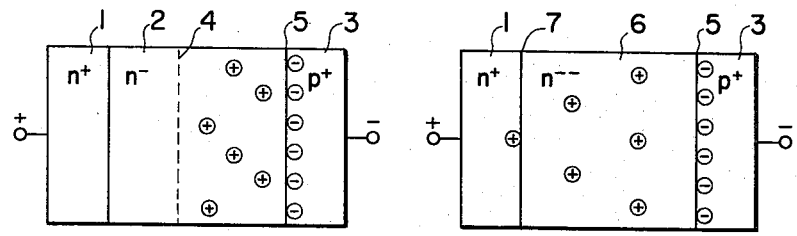
FIGS. 1A to 1D and 2A to 2D are illustrative schematic diagrams for explaining the principles of depletion layer and the potential profile in a depletion layer.
Figures 1B, 2B:
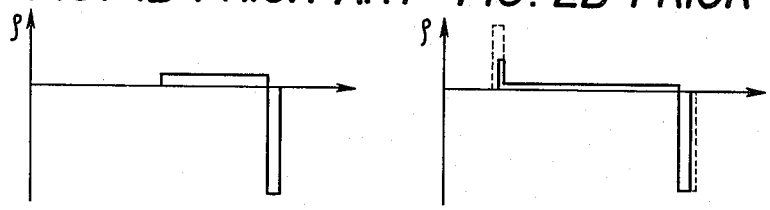
Figures 1C, 2C:
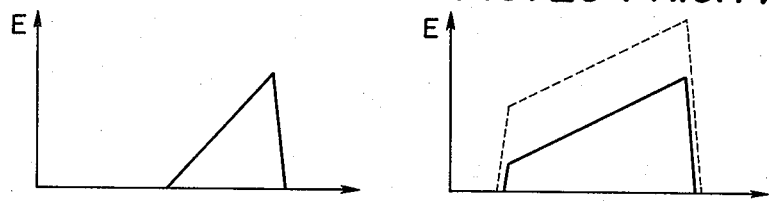
Figures 1D, 2D:
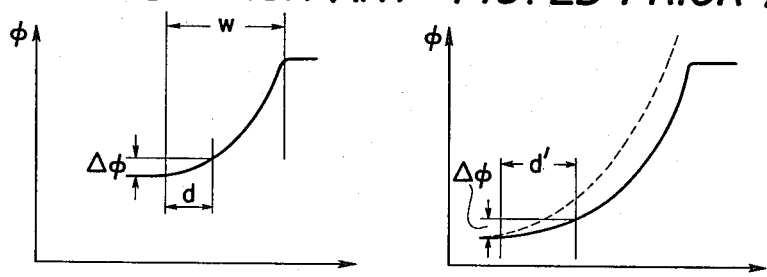

FIG. 1A shows an n+n−p+ structure across which is being applied a certain reverse bias including the built-in potential of pn junction. An n− type region 2 is present between an n+ type region 1 and a p+ type region 3. Due to a reverse bias between the n+ type region 1 and the p+ type region 3, the n+ type region 2 is locally depleted. Depletion layers are formed on both sides of the p+n− junction 5. However, if it is assumed that the impurity concentration of the p+ type region 3 is very much higher than the impurity concentration of the n− type region 2, the width of the depletion layer in the p+ type region 3 can be ignored. The end portion of that depletion layer extending from the p+n− junction 5 into the n− type region 2 is indicated at 4. The distribution of the electric charge density ρ within the depleted region will become as shown in FIG. 1B. More particularly, in the step junction, the impurity concentrations on both sides of the junction are uniform. Therefore, it can be approximated that those electric charge density ρ produced through ionization is also uniform (see FIG. 1B). Electric field E can be obtained by spatially integrating the electric charge. Accordingly, in case there are present uniform electric charge distributions in the respective regions as noted in FIG. 1B, there is produced an electric field distribution having a triangular shape as shown in FIG. 1C. It will be understood clearly that, when ionizable impurities are many, the electric charges will increase, and that the gradient of the electric field which is produced will become steep. The potential $\phi$ at a certain point in the depletion layer is given by an integration of the electric field E from the site of zero potential up to said certain point. At a site where there is an electric field which varies in such a linear pattern as shown in FIG. 1C, there is obtained a quadratically shaped potential profile as shown in FIG. 1D. Let us now assume that the impurity concentration of the n− type region 2 is represented by $N_D$, the impurity concentration of the p+ type region 3 by $N_A$, the dielectric constant of the semiconductor material by $\epsilon$, the amount of electronic charge by q, and the potential (built-in potential+externally applied voltage) between the n+ type region 1 and the p+ type region 3 by $\phi_T$. Then, the width W of the depletion layer is approximated by:

$$W = \sqrt{\frac{2\epsilon}{q} \cdot \frac{N_A + N_D}{N_A \cdot N_D} \phi_T} \quad (1)$$

In case either one of $N_A$ and $N_D$ is very much larger than the other (in this instance, $N_A \gg N_D$), the width of the depletion layer is approximated by:

$$W = \sqrt{\frac{2\epsilon}{q} \cdot \frac{\phi_T}{N_D}} \quad (2)$$

The width d of the region from the potential minimum point up to a point within the potential difference $\Delta\phi$ is approximately obtained by:

$$d = \sqrt{\frac{2\epsilon}{q} \cdot \frac{\Delta\phi}{N_D}}.$$

More concretely speaking, it is considered that in the case of a silicon transistor, when the impurity concentration $N_D$ (cm$^{-3}$) of a channel having a width 2a ($\mu$m) defined by a pair of heavily-doped gate regions satisfies the relationship $N_D \cdot (2a)^2 \leq 3 \times 10^{15}$, a potential barrier is substantially developed in the channel.

Potential profiles in semiconductor regions locally depleted as shown in FIGS. 1A, 1B, 1C and 1D have been explained. Next, by referring to FIGS. 2A, 2B, 2C and 2D, explanation will be made of the potential profiles within the n$^{--}$ type region 6 which is sandwiched between the n$^+$ type region 1 and the p$^+$ type region 3 and whose entire region is depleted.

FIG. 2A is similar to FIG. 1A. However, the impurity concentration of the intermediate n$^{--}$ type region 6 is low, and the entire region is depleted. The depletion layer further extends, after passing the n$^+$n$^{--}$ junction 7, slightly into n$^+$ region 1. FIG. 2B shows the distribution of the ionized impurity concentration (charge density) within the semiconductor regions of FIG. 2A. The total amount of the ionized electric charge is assumed to be identical with that of FIG. 1B. Due to such electric charge distribution, there is produced an electric field distribution as shown in FIG. 2C. It will be understood that, even though the total amount of electric charge is the same as that of FIG. 1B, the averaged electric field becomes strong due to the electric charge within the n$^+$ type region 1, which is at a distance from the p$^+$n$^{--}$ junction 5 and also due to the electric charge which has been spread through the entire n$^{--}$ type region. The potential difference produced across the total depletion layer becomes large. Higher potential difference produced by the same amount of charge means that the capacitance between the n$^+$ type region 1 and the p$^+$ type region 3 becomes small. Assuming now that the applied voltages are same, the amount of ionized electric charge will decrease. Furthermore, the gradient of the potential profile within the n$^{--}$ type region at sites adjacent to the n$^+$ type region 1 will become gentle. Accordingly, the width d' of the region having a potential difference $\Delta\phi$, similar to the instance of FIG. 1D, will become d'>d.

Let us now assume that the reverse bias across the terminals of the semiconductor structure shown in FIG. 2A is intensified further. Since the n$^{--}$ type region 6 has already been depleted through the entire region thereof, the depletion layer will spread within the n$^+$ type region 1 and the p$^+$ type region 3 (see the dotted line in FIG. 2B). Therefore, the electric charge will become uniformly intensified within the n$^{--}$ type region 6 due to the additional electric charge produced by such spreading of the depletion layer (see the dotted line in FIG. 2C). Such uniform electric charge forms a linear potential profile. Accordingly, the potential profile within the n$^{--}$ type region will assume the shape indicated by the dotted line which represents the addition of said linear type potential profile, changing from the shape indicated by the solid line in FIG. 2C (see FIG. 2D).

From the foregoing explanation, the basic relationship between the impurity concentration within the semiconductor body and the shape of the potential gradient where a depletion layer is formed within this semiconductor body may have been understood. However, further explanation will be made of an instance wherein there is a non-uniform distribution of impurity concentration within a region which is to be depleted.

Figure 3A:
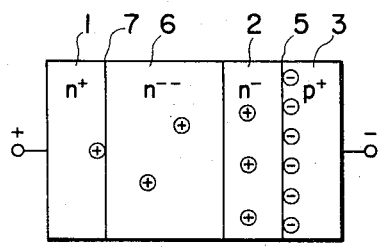
FIGS. 3A to 3D, 4A to 4D and 5 are illustrative schematic diagrams for explaining the principles of the present invention.

In FIG. 3A, there is an n$^-$ type region 2 adjacent to a p$^+$ type region 3, and an n$^{--}$ type region 6 is present adjacent to the n$^-$ type region 2, and an n$^+$ type region 1 is provided adjacent to the n$^{--}$ type region 6.

Figure 4A:
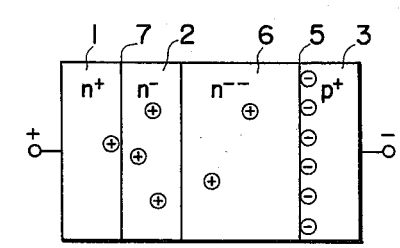
Figure 3B:
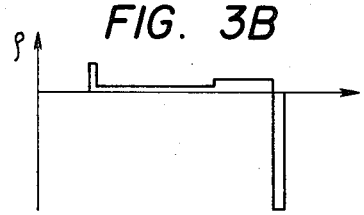
Figure 4B:
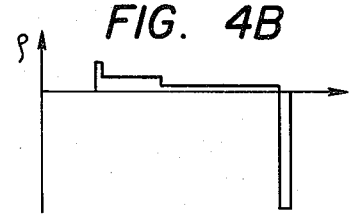
Figure 3C:
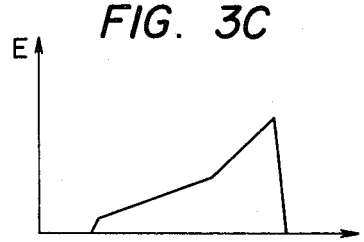
Figure 4C:
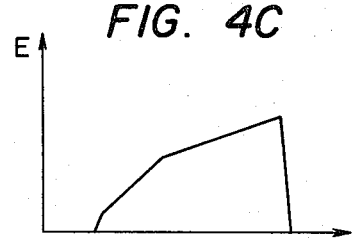

In FIG. 4A, the order of arrangement of the n$^-$ type region 2 and n$^{--}$ type region 6 in FIG. 3A is reversed. Let us now assume that a reverse bias voltage is applied between the n$^+$ type region 1 and the p$^+$ type region 3, to deplete the n$^-$ type region 2 and the n$^{--}$ type region 6. As explained previously, the voltage required for forming a depletion layer is such that this voltage is higher in the structure of FIG. 4A which has a higher impurity concentration in that region located away from the pn junction. In FIG. 3B and in FIG. 4B which show distribution of electric charge density, it is assumed that the respective amounts of the ionized total charge are equal to each other. By such electric charge density distribution as shown in FIG. 3B and FIG. 4B, there are produced electric field distributions as shown in FIG. 3C and FIG. 4C. If an n$^-$ type region 2 having a relatively high impurity concentration is present next-door to the pn junction 5, the average value of the electric field which is produced is low (see FIG. 3C). Accordingly, the potential difference (voltage) required for depleting the n$^-$ type region 2 and n$^{--}$ type region 6 is small (see FIG. 3D). Conversely, if an n$^-$ type region 2 having a relatively high impurity concentration is located at a site away from the pn junction 5 (see FIG. 4A), the average value of the electric field which is produced by the depletion will become high (see FIG. 4C), and the potential difference required for this depletion will become large (see FIG. 4D).

Figure 3D:
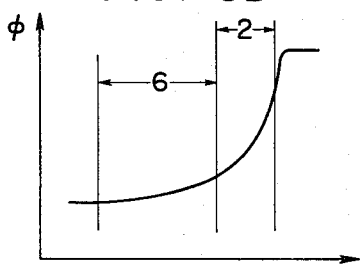
Figure 4D:
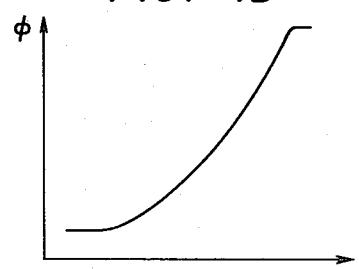

Furthermore, the potential gradients in low impurity concentration regions (region 6 in FIG. 3A, and region 2 in FIG. 4A) which are located adjacent to n$^+$n$^-$ (n$^+$n$^{--}$) junction 7 will become more gentle as the impurity concentration in such portions become lower (see FIG. 3D, and FIG. 4D).

Figure 5:
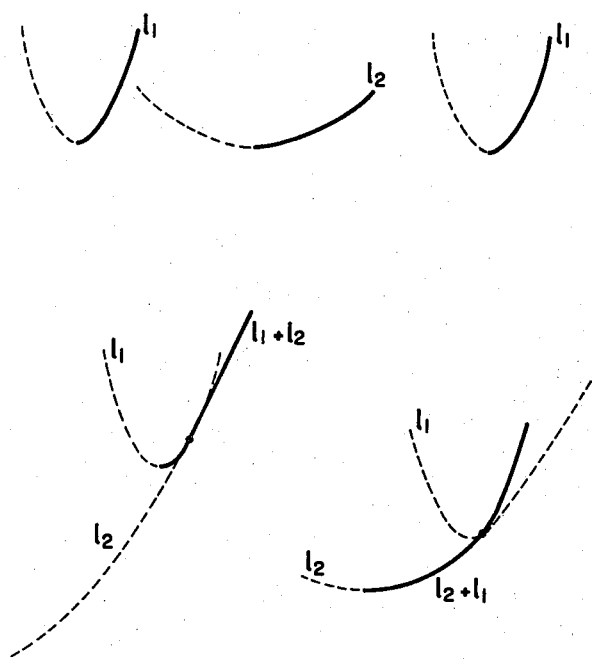

FIG. 5 shows schematically potential profiles which will develop in two adjacent regions each having a uniform impurity concentration, when these two regions are depleted. Let us now suppose that a region having a relatively high impurity concentration (hereinafter to be referred to as a low impurity concentration area or a high resistivity region) has an impurity concentration 8 times as high as that of a region having a relatively low impurity concentration (hereinafter to be referred to as a very low impurity concentration region or a very high resistivity region). Let us also assume that these two regions are depleted. The basic shapes of the potential profiles produced within these two regions are indicated by curves $l_1$ and $l_2$, respectively. The potential profile where the high resistivity region is located contiguously to a low resistivity region of the other conductivity type via a very high resistivity region is shown by ($l_1 + l_2$). Also, the potential profile in case a very high resistivity region is located contiguous to a low resistivity region of the other conductivity type via a high resistivity region is indicated by ($l_2 + l_1$). More particularly, as compared with the instance wherein the entire regions are formed by regions having the same impurity concentration, it should be understood that, in case of ($l_1 + l_2$), the potential rapidly rises along the curve $l_1$ from the potential minimum point, and then the potential will rise relatively gently along the curve $l_2$. However, even in this case, the differential coefficients of these two curves continue with each other at the connection point of $l_1$ and $l_2$. In contrast thereto, in case of $(l_2+l_1)$, the potential rises gently along the curve $l_2$ from the potential minimum, and will rapidly rise after being switched over to the curve $l_1$. In this instance, the potential difference within the very high resistivity region $l_2$ can be suppressed to an extremely small value by selecting the impurity concentration of this very high resistivity region at a low value.

In these two cases, the potential rises from the potential minimum point of a region up to the boundary of the concerned region in accordance with a function determined by the impurity concentration of the region. In the next region, the potential will rise in accordance with the function which is determined by the impurity concentration of this latter region. These two functions continue to each other in such a way that differential coefficients will continue to each other at the boundary of the adjacent two regions.

If a low impurity concentration region is completely depleted and a further reverse bias is applied, the voltage above the one required for forming the depletion will be applied uniformly throughout a low resistivity region, as shown by dotted line in FIG. 2C.

Next, explanation will be made of a low impurity concentration channel region of a static induction type semiconductor device. When the channel region located between two gate regions is considered, there is a potential minimum point in the vicinity of the center of the channel, and the potential for majority carriers rises as the position approaches the gate regions. That portion in the channel region located between two gate regions which serves as the effective channel region is located substantially at that portion corresponding to the potential minimum point and having a potential difference on the order of the thermal energy. Namely, let us assume that the Boltzmann distribution and a constant density of state hold for majority carriers. Then, the number of the majority carriers having energies higher than $V_G^*$ can be approximated by $N_o \cdot \exp(-V_G^*/kT)$, wherein $N_o$ is a constant representing total number of available carriers, $V_G^*$ threshold energy, and $kT$ thermal energy. Thus, the number of carriers having energies higher than $(V_G^*+kT)$ is about $\frac{1}{3}$ of the number of the carriers having energies higher than $V_G^*$. This means that at least about $\frac{2}{3}$ of the current-forming majority carriers pass through such part of the current channel that has a potential energy between $V_G^*$ (minimum value) and $V_G^*+kT$. Considering a region corresponding to the potential energy between $V_G^*$ and $V_G^*+3kT$, at least about 95% of majority carriers pass therethrough. On the other hand, the potential profile between the gate regions has a gradually increasing gradient from the center toward each of the gate regions, as described above. Therefore, a region having a potential energy between $V_G^*$ and $V_G^*+3kT$ is not three times but about one and a half times wide the region having a potential energy between $V_G^*$ and $V_G^*+kT$, provided that the channel region has a uniform impurity concentration. The width of such effective channel depends on the impurity concentration of the concerned region including the effective channel. If the impurity concentration is elevated, the width of the effective channel will decrease. However, the gate spacing, i.e. the width of the channel region, can be decreased. In order to obtain a wide effective channel, it is only necessary to lower the impurity concentration of the channel region. By so doing, if the channel region is formed by a region having a single impurity concentration, there will be the need to increase the width of the channel region. If the impurity concentration is lowered, the built-in potential between the gate region and the channel region will become small. Accordingly, there is a high possibility that minority carrier injection from the gate region takes place to such an extent more than necessary. As such, it will be understood that, in order to provide a wide effective channel width and to narrow the width of the entire channel region, it is only necessary to form a relatively high impurity concentration region on the outer side of the effective channel region, as explained in connection with $(l_2+l_1)$ in FIG. 5.

Also, as will be understood from the instance of $(l_1+l_2)$ shown in FIG. 5, in the very low impurity concentration region located adjacent to the low potential, low impurity concentration region, said region is subjected to the influence of the potential profile in the low impurity concentration region, and the potential gradient will become steep. Accordingly, by forming, adjacent to the channel region, on the side opposite to the source region, i.e. on the drain side, a relatively high impurity concentration region which will assume a low potential, an effect similar to that stated above will be obtained. This is because, in the very low impurity concentration channel region, potential rises progressively as the location approaches closer to the gate region, and therefore the potential difference between the very low impurity concentration region and the low potential region also will become higher as the location approaches closer to the gate region. Thus the potential gradient becomes much steeper.

Next, approximating that there is an intrinsic gate between the source region and the gate region, explanation will be made of the operation mechanism for controlling the potential of this intrinsic gate with a gate potential. In order that a static induction type semiconductor device be rendered "off", it is necessary that the region from the gate region to the intrinsic gate become depleted, and that, accordingly, the potential of this intrinsic gate become higher than that of the source region. The channel thus becomes pinched off. The application of a drain voltage (in the case of thyristor, the voltage of the other one of the main electrodes, i.e. anode or cathode) functions to lower the potential of the intrinsic gate. Thus, an application of a higher reverse gate bias voltage is required. In order to render the device "on", the applied gate voltage is switched over to a forward bias voltage to lower the potential of the intrinsic gate. Thus, how much the potential of the intrinsic gate will change for such change-over from the reverse voltage to the forward bias voltage of the gate voltage applied will become a problem. Suppose that this ratio of change is expressed as being $\eta$ ($<1$). The closer this $\eta$ is to 1, the better the efficiency of the gate voltage will become. The fact that $\eta$ is high leads to the fact that the voltage amplification coefficient $\mu$ is great, and this constitutes an important factor also for the improvement of high frequency characteristic. Up to the time at which the region between the source region and the gate region is rendered completely depleted, the potential between the intrinsic gate and the gate structure will vary by various parameters. It will be understood easily, however, that the shorter the distance between the intrinsic gate and the gate structure is, the smaller the potential will become. Also, it will be understood that, from the examples of $(l_1+l_2)$ and $(l_2+l_1)$ in FIG. 5, for longer the region between the intrinsic gate and the source region is and also the higher its impurity concentration is, the greater the ratio of the potential between the source and the intrinsic gate will become relative to the potential between the source region and the gate region. After the region between the source region and the gate region has become completely depleted, this $\eta$ has a tendency to become closer to 1 (meaning to become greater), in proportion with smaller ratio of the intrinsic gate-gate distance against the source-gate distance. Accordingly, for this purpose the smaller the gate spacing is, the better. In order to cause a large current to flow, however, it is necessary that a number of carriers be injected from the source region, reach the intrinsic gate and go over the intrinsic gate toward the drain region. Accordingly, the source-to-intrinsic gate distance preferably is short and the width of this intrinsic gate preferably is wide. Therefore, a compromise had better been made. The dimensions and the impurity concentration of the region located between the source region and the intrinsic gate need to be determined in association with the entire structure of the device. In a device wherein minority carrier injection from the gate region is positively utilized, it is further desirable that the distance between the source region and the intrinsic gate be short.

The foregoing explanation is based on a simplified model, and therefore in case of designing a practical device, such designing will require more detailed review and many trials and errors.

Figure 6A:
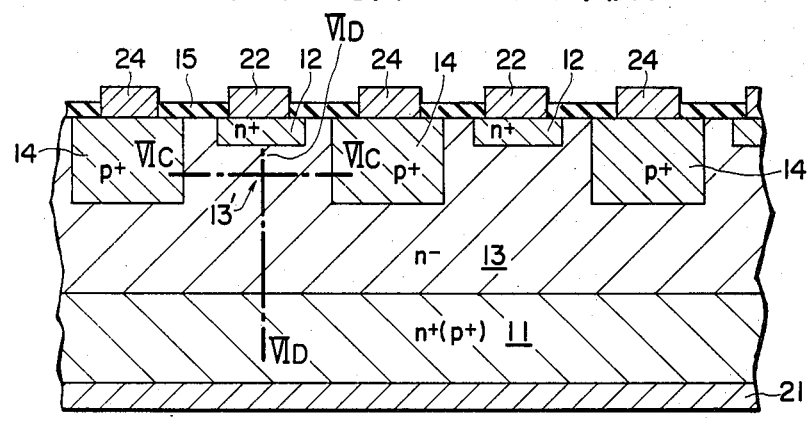
FIGS. 6A and 6B are a schematic vertical sectional view and a schematic plan view of a conventional static induction type semiconductor device, respectively.
Figure 6B:
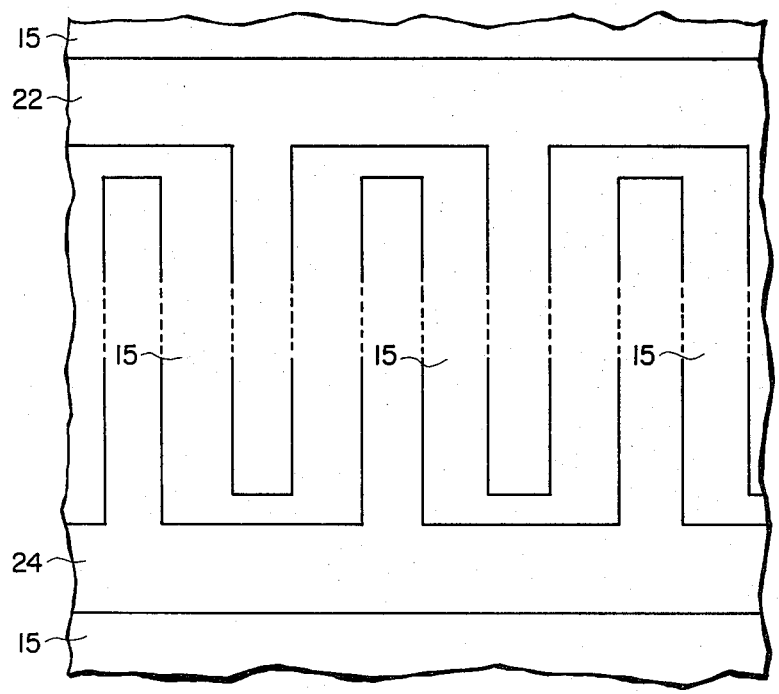

An example of known static induction type transistors and thyristors having junction-type surface gates will be explained hereunder by referring to FIGS. 6A to 6D. FIG. 6A represents a sectional view, and FIG. 6B is a top plan view. In the sectional view of FIG. 6A, an n⁻ type region (epitaxial layer) 13 is formed on top of an n⁺ (or p⁺) type silicon stubstrate 11. It is needless to say that an n⁺ (or p⁺) type region may be provided on the n⁻ type substrate. In case of transistor, the region 11 is an n⁺ type and constitutes a drain. In case of thyristor, said region is of the p⁺ type and constitutes an anode. It should be understood that, in case of thyristor, the regions 11 and 13 jointly form a p⁺n⁻ diode structure. In the upper portion of the n⁻ type region 13, there are formed a shallow n⁺ type source (or cathode) region 12 and a relatively deep p⁺ type gate region 14 by relying on diffusion technique, ion-implantation technique or a combination of selective etching and selective growth techniques. The p⁺ type region 14 represents a gate region of an n-channel static induction type transistor or thyristor. This p⁺ type gate region 14 desirably has a high impurity concentration so as to have as low resistivity as possible within the range not adversely affecting the functions of the device due to re-distribution of impurity concentration caused by, for example, heat treatment, the development of distortion within the crystal, and so forth. The n⁻ type region 13′ sandwiched between the p⁺ type gate regions 14 and intended to serve as the channel region will be selected to have a width and an impurity concentration such that the depletion layer extending from the boundary between this region and the gate region (pn junction surface) under certain operation conditions will cross the channel region to form a potential barrier. The impurity concentration of this region is selected usually to be within the range of $10^{10}$–$10^{16}$ cm⁻³. The impurity concentration and the thickness of the n⁻ type region 13 located between the p⁻ type region 14 and the n⁺(p⁺) type region 11 are set by taking into consideration mainly the breakdown voltage and/or forward blocking voltage factors. On the exposed surface of the n⁺(p⁺) type region 11, the n⁺ type region 12 and the p⁺ type region 14, low resistivity electrodes 21, 22 and 24, respectively, are provided which are made with aluminum, molybdenum or other metals or with a low resistivity polysilicon or like materials. On those portions where there are no electrodes, a passivation film 15 is provided. Film 15 may be made with an oxide film, a nitride film or other insulating film or a composite insulating film. The n⁺ type source region 12 and the p⁺ type gate region 14 extend perpendicular to the sheet of drawing so as to be elongated narrow regions, to make the value of current large. Materialization of large current is contemplated by providing an increased number of channels also.

FIG. 6B shows a simplified top plan view of FIG. 6A. Electrodes 22 and 24 form a mutually facing juxtaposed comb shape or inter-digitated shape. The teeth portions of the comb-shape are electrically connected to the source region 12 and the gate region 24, respectively. Excluding the outermost two, the respective gate regions 14 are common to the channel regions located on both sides of each gate region. The mutually facing two gate regions 14 define one channel region 13′.

Figure 6C:
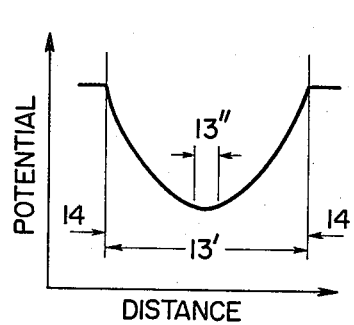
FIGS. 6C and 6D are schematic diagrams showing potential profiles in the devices of FIGS. 6A and 6B as viewed along the lines VIC—VIC and VID—VID in FIG. 6A.

In FIG. 6C is shown the potential profile for those electrons within a section of the channel located between adjacent two gate regions in the state that the channel region 13′ is depleted (pinched off) by a gate voltage including the built-in potential between the gate region 14 and the channel region 13′. It should be understood here that, as is noted in FIG. 6C, the impurity concentration of the gate region 14 is very high as compared with the impurity concentration of the channel region. Thus, it can be approximated that there is no potential gradient in the gate region 14.

The inclination or the gradient of the potential formed within the channel region 13 depends on the impurity concentration of this channel region. This potential gradient becomes steep if the impurity concentration of the channel is high, and will become gentle if the impurity concentration is low. Most of those electrons which are to travel toward the drain (anode) region from the source (cathode) region will flow passing through that portion 13″ at which the potential is the lowest.

Figure 6D:
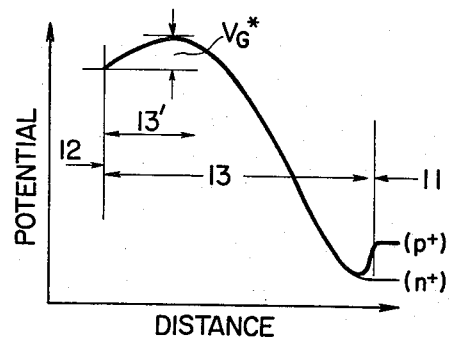

In FIG. 6D, there is shown the potential profile for electrons between the n⁺ type source (or cathode) region 12 and the n⁺ type drain (or p⁺ type anode) region 11 when a forward voltage is applied between these regions. As explained in connection with the potential gradient in the section of channel, the potential gradient is subjected to the influence of impurity concentration. In order to narrow the portion in which the potential gradient is gentle, it is effective to raise its impurity concentration.

In the channel region 13′, the potential is elevated due to the influence of the gate potential, and this potential forms a saddle shape. The potential at the saddle point, i.e. the potential barrier $V_G^*$, is controlled by the gate potential so as to control the current formed by electrons. When the potential barrier $V_G^*$ lowers, this will increase those electrons having an energy greater than $V_G^*$. Accordingly, a number of electrons will flow from the source region 12 toward the drain (or anode) region 11. In the case of transistor, the current of electrons controlled in such a way as mentioned above forms the main current, so that the drain current is approximated basically as $I_D \propto \exp(-qV_G^*/kT)$. Herein, k represents Boltzmann constant; T represents absolute temperature; and q represents electronic charge. In case of thyristor, those holes which are present in the p+ type anode region, will be more stable at a location having a higher potential in this Figure, since the potential for a hole is an upsidedown version of the potential for an electron. However, until the potential barrier of p+n− junction remains in the foreground of the anode, the holes will not enter into the region 13 and thus are prevented from entering therein. When electrons which have flown in and accumulated in the portion produced by the pn junction between the n− type region 13 and the p+ type anode region 11 which serves as a barrier for holes, and this portion is charged negative as a result of such accumulation, the barrier for holes will disappear, and holes will be injected from the anode p+ type region 11 into the channel region 13, so that the device will be quickly rendered to "on" state. When the potential barrier at the pn junction disappears in this way, a number of holes will flow from the p+ type anode region into the n− type region 13. Since the potential profile for holes is inverted in configuration of the potential profile for electrons, the large amount of holes which have been injected will flow in the reverse direction relative to that of the electrons. Those holes which have approached the source region and also those electrons which have approached the anode region further have the effect of pulling out carriers of mutually opposite polarities, respectively.

The p+ type gate region 14 has a potential slightly lower than that of the channel region, for holes. Therefore even when there is some mutual action between electrons and holes, a part of holes will flow into the gate region. When the p+ type gate region 14 is reverse biased at a value above a certain value, the potential barrier $V_G^*$ becomes intensified, and thus the flow of electrons will be cut off. Due to this cut-off of the current of electrons, the transistor will be turned off. In a thyristor, the region between the cathode and the anode will be electrically disconnected due to the cut-off of the current of electrons. However, those holes which are present in the n− type region 13 will flow into the p+ type gate region 14 having a lowered potential. Thus, when holes cease to be present in the n− type region located between the intrinsic gate and the p+ type anode region, the electric current will be cut off. In other words, this means that the timing at which the electric current becomes nil and the timing at which the cut-off state is brought about are different from each other.

In such static induction type semiconductor device, those factors which determine the characteristic are, first of all, series (negative feedback) resistance $R_S$ and true transconductance $G_m$. Excluding special instances, it is desirable that $R_S$ is as small as possible, and $G_m$ is as large as possible. In order to reduce this $R_S$, it is effective not to form an elongated lengthy portion within the effective channel, but to arrange so that carriers will be able to pass through a wide and short channel.

The potential $V_G^*$ of the intrinsic gate is controlled by a voltage $V_{SG}$ which is applied to the gate electrode 24. This relationship can be approximated as: $\Delta V_G^* = \eta \Delta V_{SG}$. Here, the gate voltage efficiency $\eta$ is a value smaller than 1 which shows the proportion of that voltage component applied between the source region and the intrinsic gate among the source-gate voltage. The closer to 1 $\eta$ is, the more effectively will the potential of the intrinsic gate be controlled. The apparent transconductance $g_m$ can be approximately expressed by:

$$g_m = \frac{\Delta I_D}{\Delta V_{SG}} = \Delta I_D \cdot \frac{\eta}{\Delta V_G^*} \propto \eta I_D \left( \because \frac{\Delta I_D}{\Delta V_G^*} \propto I_D \right).$$

The greater $I_D$ is, and the greater $\eta$ is, the larger this apparent transconductance will become, and also the larger the gain will become, and thus they will become effective for high frequency operation or high-speed switching. In order to increase $I_D$, it is necessary to reduce $R_S$. Accordingly, it is effective to make the effective channel width wider. On the other hand, in order to make $\eta$ large, it is effective to narrow the gate spacing, and to relatively increase the distance between the source region and the intrinsic gate. These factors have a tendency to increase the series resistance $R_S$. Therefore, in conventional static induction type semiconductor devices, there has been a limit in increasing $G_m$ and reducing $R_S$. Also, in order to increase packing density in integrated circuit structures, it is effective to narrow the gate spacing. This, however, also tends to lead to increasing $R_S$, and thus there has been a limit in elevating packing density.

The present invention proposes a channel structure which reduces $R_S$ and increases $I_D$ and $\eta$.

Figure 7A:
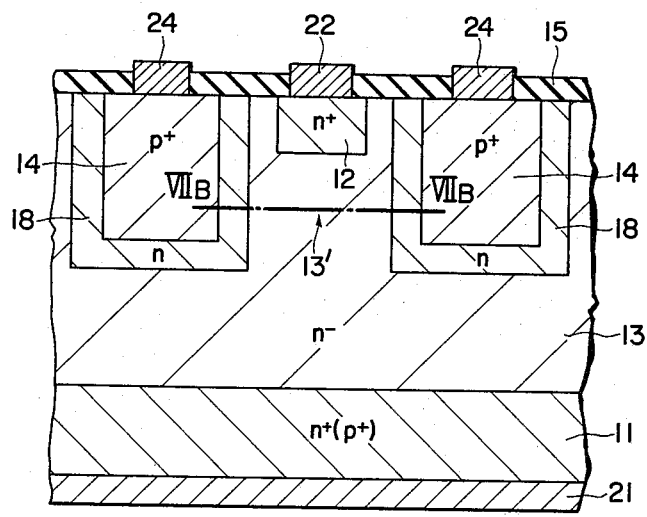
FIGS. 7A and 7B are a schematic vertical sectional view of a static induction type semiconductor device according to an embodiment of the present invention, and a schematic diagram showing the potential profile along the line VIIB—VIIB in FIG. 7A, respectively.
Figure 7B:
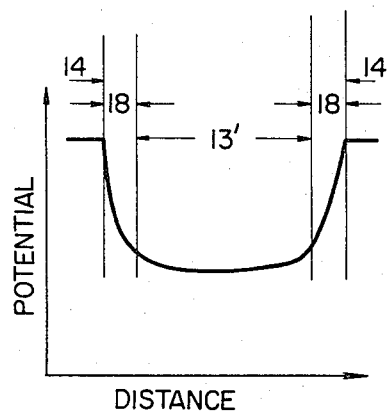

FIGS. 7A and 7B show an example of static induction type semiconductor device according to the present invention. For the sake of simplicity, the portion of the device containing only a single channel is shown in these Figures. The feature of this example resides in the arrangement that an n type region 18 having an impurity concentration higher than that of the n− type channel region 13' is provided around a p+ type gate region. The potential profile for electrons between the gate regions along the line VIIB—VIIB is shown in FIG. 7B. The channel region 13', having a small impurity concentration, develops only a small potential difference even when ionized. On the other hand, the n type region 18, having a high impurity concentration, produces a large potential difference when ionized, i.e. when depleted. For example, under the condition that the channel region is turned "on", if the impurity concentration of the channel region 13' is designed to be at a low level to such an extent that the potential difference produced in the channel region 13' under said conditions is about the thermal energy, it is possible to make the effective channel width substantially equal to the width of the channel region 13'. For example, in a conventional static induction type transistor, if there is a potential difference of 1V between the gate region and the intrinsic gate, the width of the effective channel region having a potential within thermal energy from the potential of the intrinsic gate is in the order of 16% of the width of the channel region when calculated on a simple one dimension model. If the impurity concentration of the channel region 13' is lowered by one order in accordance with this example, it is possible to increase the width of the effective channel region up to about 50% of the width of the channel region. In case the impurity concentration is lowered to about 1/40, it is possible to increase the width of the effective channel region up to almost the entire width of the channel region. In practice, carriers tend to flow collectively through a lower potential region, and therefore it will be understood clearly that the effect of this instant example is greater than the result of the aforesaid simplified calculation. Furthermore, if the reverse gate bias is much greater also, the width of the effective channel region will become much narrower, and therefore the effect of this instant example will be exhibited more prominently. It is desirable that the impurity concentration of the subsidiary channel region 18 be set higher than that of the channel region 13' preferably by more than one order of magnitude, but that it is set lower than that of the gate region 14. It is also desirable that the width of this subsidiary channel region 18 is one half or less of the half width of the channel.

The gate voltage efficiency $\eta$ also will improve by the amount that the distance between the intrinsic gate and the gate region is narrowed due to the presence of the region 18. In case the device of this example is to be rendered "off", the potential of the channel quickly rises, and so that the cut-off of the current is carried out quickly. The potential difference produced in the n type region 18 and the potential difference produced in the $n^-$type region 13' are obtained, in principle, by resolving Poisson's equation. However, it is desirable to seek optimum conditions through experiments.

The provision of this subsidiary channel region 18 has the advantages that, not only can the width of the effective channel be widened, but also, according to the structure of this example, the impurity concentration of the n type region 18 around the gate region can be made high as compared with the instance wherein the channel is formed by a region of a uniform impurity concentration. Thus the built-in potential can be made large. Accordingly, under a forward biasing condition, the injection of minority carriers from the gate region into the channel region decreases. Furthermore, the reverse breakdown voltage condition between the $p^+$type gate region 14 and the $n^{30}(p^+)$ type drain (anode) region 11 can be moderated. In order to obtain a high-speed turn-on operation and to cause a large current to flow, it is desirable to arrange the distance between the intrinsic gate and the source region 12 small, and also to set the impurity concentration of the source region high. This is because the lack of either one of these two conditions will result in, when the potential of the intrinsic gate is lowered, a limit on the amount of electrons which flow over the potential. If the distance between the intrinsic gate and the source region 12 is reduced, the gate voltage efficiency $\eta$ tends to decrease. However, according to the structure of this instant example, the distance between the gate regions can be shortened, so that it is possible to make the gate voltage efficiency $\eta$ high, and/or to make the distance between the source region 12 and the intrinsic gate small. Depending on the purpose, either one of these two may be improved.

In a thyristor, in order to cause a large current to flow, it be desirable that the impurity concentration of also the $p^+$type anode region is set high. In conventional SIT thyristor structure, when it is intended to satisfy these conditions, the limiting factor for the breakdown voltage has been the punch-through phenomenon between the $p^+$ type gate region 14 and the $p^+$ type anode region 11, which, more particularly, means "reverse breakdown" at pn junction between the $p^+$ type gate region 14 and the $n^-$ type region 13. If, however, the n type region 18 is added according to the structure of this example, this specific condition is mitigated, so that it is effective also to lower the resistance at the "on" state of thyristor.

Illustrations have been made with respect to instances wherein the gate region, the source region and other regions have a substantially rectangular sections. It should be understood that no trouble will arise from making such structure as can be obtained by ordinary diffusion technique. In such case, analysis may become difficult, but it is only necessary to seek optimum conditions through experiments. Furthermore, high precision diffusion technique can be advantageously utilized to form the subsidiary channel region 18 through the gate mask. It will be apparent to those skilled in the art that the conductivity types of all the regions may be reversed. It should be understood also that those structures illustrated in the above-said examples are just for exemplary purpose and that they are in no way limiting.

Figure 8:
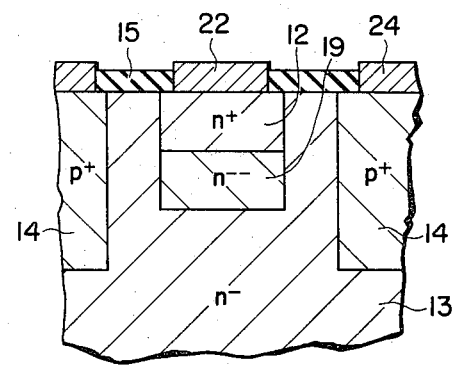
FIG. 8 is a schematic vertical sectional view of a static induction type semiconductor device according to another embodiment of the present invention.

Another example of the present invention is shown in FIG. 8. In the example of FIG. 7A, there is provided an n type region 18 around the $p^+$ type gate region 14 to narrow the gate spacing and to widen the effective channel width. In this instant example of FIG. 8, conversely to the example of FIG. 7A, the impurity concentration of that portion at which is to be formed an intrinsic gate is lowered. In FIG. 8, an $n^{--}$ type region 19 having an impurity concentration lower than that of the $n^-$ type region 13 represents the additional region according to the present invention. This $n^{--}$ type region 19 is located adjacent to the $n^+$ type source region, and is formed to have a thickness smaller than that of the gate region 14.

In this example, the $n^{--}$ type region 19 has a very low impurity concentration. Therefore, this region is easily depleted by only a small potential difference, and provides a wide effective channel width. At the same time, this $n^{--}$ region 19 has a potential for holes which is lower than that of the $n^-$ type region 13. Accordingly, when the $p^+$ type gate region 14 is forward biased, those holes injected from the $p^+$ type gate region 14 gather in the $n^{--}$ type region 19, and these holes function effectively to pull out electrons from the $n^+$ type source region 12. By increasing the length of the $n^{--}$ type region 19 in the direction of current, the gate voltage efficiency will increase. On the contrary, by decreasing this length, there can be obtained the advantage of materializing high-speed operation. It is preferred to vary this length within the range of, for example, 0.1 $\mu$m–10 $\mu$m. In the above-described example, $n^{--}$ type region 19 has a sectional area identical with the $n^+$ type region 12. It will be apparent for those skilled in the art that the dimensions of these two regions may be altered appropriately. The essential point of this example lies in the provision of a very low impurity concentration region adjacent to a high impurity concentration source region.

Figure 9A:
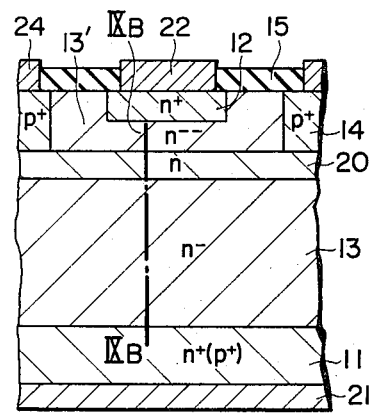
FIGS. 9A and 9B are schematic vertical sectional view of a static induction type semiconductor device according to still another embodiment of the present invention, and a schematic diagram showing the potential profile along the line IXB—IXB in FIG. 9A.
Figure 9B:
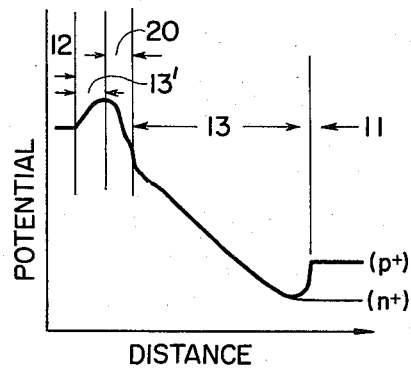

In FIGS. 9A and 9B, there is shown another example designed to further accelerate the materialization of high-speed operation. In this example, an $n^{--}$ type region 13' of a very low impurity concentration is formed to surround the source region. Also, adjacent to this $n^{--}$ type region 13', there is provided an n type region 20 having a relatively high impurity concentration and having a small thickness in the direction of source-drain (anode) direction. Since this $n^{--}$ type region 13' has a low impurity concentration, it exhibits, basically, a relatively flat potential profile. However, being subjected to the influence of the potential profile in the n type region 20 located on the drain (anode) side, this n−− type region 13' has a relatively steep potential gradient in the vicinity of the gate region 14. As a consequence, the potential profile which is obtained is such that between the gate regions, it is of the type resembling that of the preceding example, and there are obtained a wide effective channel width and a narrow gate spacing.

As illustrated in FIG. 9B, within the n type region 20, there is formed a relatively steep potential gradient in the source-drain (anode) direction. Thus, there is produced an electric field for intensively accelerating the speed of those electrons travelling toward the drain (anode) region from the source region and crossing over the potential barrier. It should be understood that the intrinsic gate is formed in the n−− type region 13' which is located adjacent to the source region 12, and that those electrons which have passed through the intrinsic gate will be intensively accelerated in speed when they enter into the n type region 20 because of the strong electrical field produced. Thus, the travelling time of electrons is reduced, and accordingly high-speed operation is obtained. However, it is often desirable to have the n type region 20 and the n− type region 13 substantially depleted in the main operation region. Therefore, it is preferred that the impurity concentration of the region 20 is not made very high, to be easily depleted. In this example, a relatively high impurity concentration n type region 20 is arranged so as to cover the p+ type gate region also. Therefore, the maximum permissible voltage between the gate region and the drain (anode) region is improved also. For example, in a thyristor, occurrence of gate-anode punching-through can be mitigated. The p+ type gate region 14 may be formed to locally intrude into the n type region 20, or it may be slightly separated therefrom. The presence of the n−− type region 13' serves to improve the source-gate breakdown voltage, and also serves to lower the source-gate capacitance. These factors jointly improve the characteristic of the thyristor of this structure. It should be understood that the impurity concentration of the n− type region 13 may be arranged either equal to or less than the impurity concentration of the n−− type region 13' depending on the purpose.

Figure 10A:
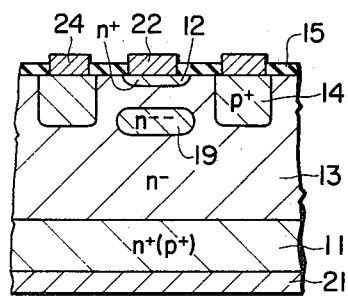
FIGS. 10A, 10B, 11, 12A, 12B, 13 and 14 are schematic cross sectional views of static induction type semiconductor devices according to further embodiments of the present invention.
Figure 10B:
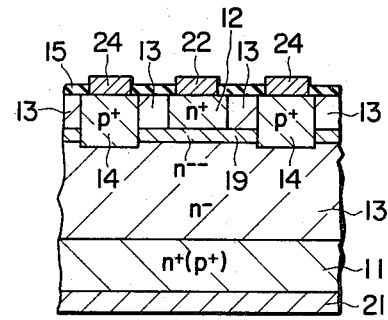

Alterations of the structure of FIG. 8 are shown in FIGS. 10A and 10B. FIG. 10A shows an instance wherein the n−− type region 19 is separated from the source region 12, instead of being adjacent thereto. This structure is effective in widening the width of the effective channel, and it may be manufactured by impurity compensation by ion implantation. Similar alterations may be made for the structure shown in FIG. 9 also.

In FIG. 10B, the n−− type region 19 having a very low impurity concentration extends between the gate regions within the channel region 13. As has been explained in connection with FIG. 9A, the potential profile within the n−− type region 19 is subjected to the influence of the potential profile within the n− type region 13, and accordingly it becomes gentle at the central portion, and it becomes steep in the vicinity of the gate region. In the normally-off mode device, a forward gate voltage is employed usually. Therefore, minority carriers, though small in number, are injected into the channel region from the gate region and may cause minority carrier storage effect. In known structures, this storage of minority carriers has had an adverse effect on the operation speed and on the frequency characteristic. In contrast thereto, in the structure shown in FIG. 10B, it should be understood that that site on the boundary of the gate p+ region 14 at which the built-in potential is the lowest is located at the site at which the gate p+ region 14 is contiguous with the n−− type region 19. In the other low impurity concentration region 13, the impurity concentration is relatively higher than at the n−− type region 19, and therefore the built-in potential also becomes high. As such, it will be understood that the portion into which minority carriers are most easily injected will be the n−− type region 19. Since this n−− type region 19 is located adjacent to the source region 12, those holes which have been injected into the region 19 will induce the injection of electrons, and thus the resistance at the "on" state becomes much smaller and accordingly power dissipation becomes small. Furthermore, the portion in which the potential gradient in the direction of current is gentle is smaller, so that the storage effect also becomes very small.

The present invention can be advantageously applied to devices having split-gate structure. A split-gate structure has the advantage of reducing the effective gate capacitance. In a transistor or thyristor of the enhancement mode, a current flows due to minority carriers, passing through the gate regions. However, with a split-gate structure, i.e. the gate is split into an active (drive) gate which positively carries out control, and into a passive (fixed) gate for usually maintaining a constant potential such as at a reference potential, it is possible to reduce the current which flows through a substantial controlling electrode. Taking up a thyristor as an example, a current flows into the channel from the gate which is forward biased at the time of turn-on, and a current flows into the gate from the channel at the time of turn-off. Of these two types of currents, what constitutes a problem especially is the current which flows into the gate when turned off. This problem, however, can be improved by connecting the passive gate to the source region and by making entry of minority carriers into the active gate relatively difficult. Minority carriers having flown into the passive gate region only constitute part of the main current.

Figure 11:
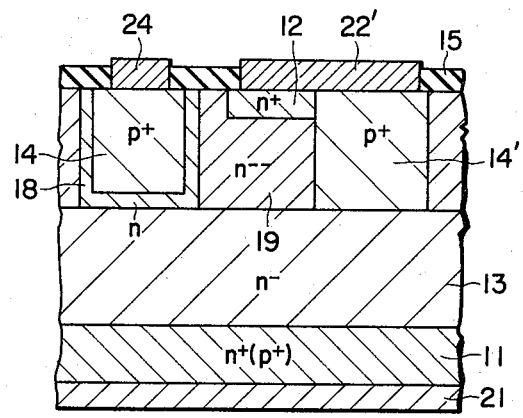

In FIG. 11 is shown an example of split-gate structure. A gate region is split into an active gate region 14 and a passive gate region 14'. The active gate region 14 is surrounded by an n type region 18, so that a channel region is formed at an n−− type region 19. An n+ type source region 12 is located adjacent to the p+ type passive gate region 14', and a source electrode 22' is formed in common to the n+ type source region 12 and to the p+ type passive gate region 14'. Because of the arrangement that the active gate region 14 is surrounded by the n type region 18, the amount of minority carrier injection from the active gate region 14 is reduced, so that those minority carriers which have been injected into the channel region will pull out majority carriers from the n+ type source region 12, and the minority carriers will be absorbed into the passive gate region 14' held at a lower potential and having a lower built-in potential. Accordingly, the storage effect of minority carriers is small. In case of thyristor, the current which flows through the passive gate region 14' at the time of turn-off will merge into the main current since this passive gate is directly connected with the source region, and accordingly the current flowing into the passive gate region 14' will cause no problem, and owing to the presence of the n type region 18, the current which flows through the active gate region 14 will become small. Furthermore, locating the n+ type source region 12 adjacent to the passive gate region 14' and away from the active gate region 14 (insertion of the n−− type region 19 and the n type region 18 between the source region 12 and the active gate region 14) will form the main current flow near the passive gate region 14' and away from the active gate region 14. This also reduces the current flowing through the active gate region 14.

Explanation has been made of the present invention with respect to a static induction type semiconductor device of vertical planar junction gate structure. It is needless to say that the present invention may be applied equally effectively to a horizontal structure, upside-down type structure, embedded gate type structure, recessed gate type structure, insulated gate type structure and Schottky gate type structure.

Figure 12A:
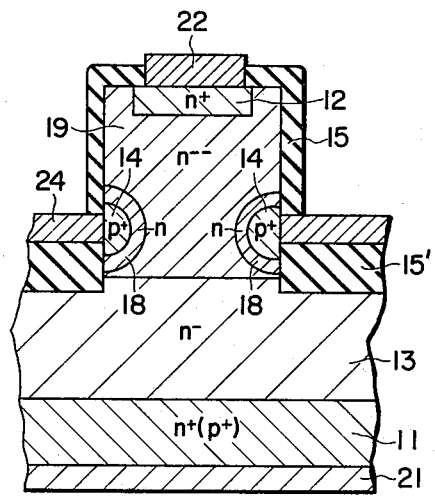
Figure 12B:
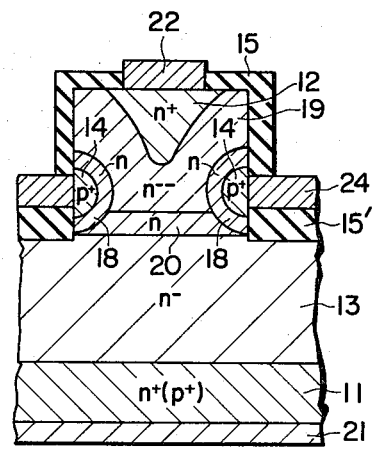

Example of recessed gate type structures embodying the present invention are illustrated in FIG. 12A and 12B. In FIG. 12A, an n type region 18 surrounds a p+ type gate region 14, and an n−− type region 19 which is adjacent to the n+ type source regoin serves as a region constituting a channel. In FIG. 12A, reference numeral 15' represents a thick insulating film. In FIG. 12B, there is further provided an n type region 20 for enhancing high-speed operation, and an n+ type source region 12 has such configuration as protruding into the channel region. This protruding n+ type channel-region 12 contributes to reducing the inter-electrode distance, and thereby to reducing the transit time of carriers. Thus, high-speed operation is further enhanced.

Figure 13:
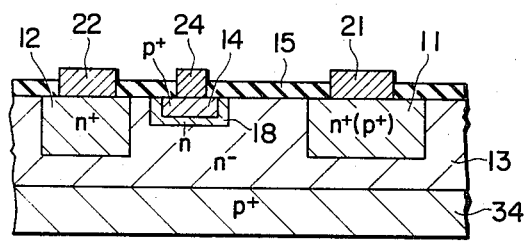

In FIG. 13 an example of horizontal type structure is shown. On top of a p+ type substrate, there are formed an n− type channel region 13, an n+ type source region 12, an n+(p+) type drain (anode) 11, and a p+ type gate region 14. An n type region 18 is formed so as to surround the p+ type gate region 14. The structure of this example has many resemblances with the embodiment of FIG. 7A excluding that this is of the horizontal type. Since the impurity concentration of the n+ type region is selected to be low, it is possible to obtain a wide effective channel width. It will be understood that structures similar to those of the respective embodiments having been explained can be made by the horizontal type structure also.

Figure 14:
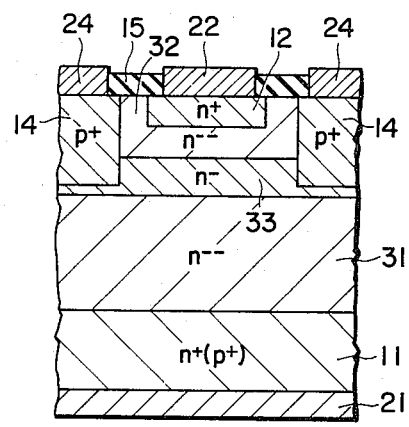

In integrated circuits, it is often the case that integration density and efficiency η are especially desired to be improved. To meet such demands, it is most important to reduce the gate spacing. An example suitable to such instance is shown in FIG. 14. This example has the arrangement that a low impurity concentration region 33 is provided locally between the channel regions 31 and 32 having a very low impurity concentration. Thus, this example has the relationship of impurity concentration which is the opposite of that of FIG. 9A. By adjusting the impurity concentration of the region 33, the gate spacing is reduced, and due to the presence of very low impurity concentration regions 31 and 32, the gate-source capacitance and the gate-drain capacitance are reduced. Furthermore, in the low impurity concentration region 33, the potential gradient becomes steep and accordingly the transit time of carriers will become short. The very low impurity concentration region 32 which is located between the gate region and the source region is easily depleted by the application of a gate voltage, and also the region of very low impurity concentration located between the gate region and the drain region is easily depleted by a gate-drain voltage. Accordingly, it is easy to maintain both the gate voltage efficiency η and the voltage amplification factor μ constant. It is, however, necessary that the saddle point of potential profile be positioned within the low impurity concentration region 33. It will be understood easily that this low impurity concentration region 33 need not extend from one gate region to another gate region. For example, like the region 19 in FIG. 10, it may be provided only at the central portion of the channel, or it may be provided so as to extend from one of the gate regions to a midway of the channel region. By adopting a recessed gate and/or the projecting source structure, it is possible also to obtain a further high frequency operation.

Figure 15:
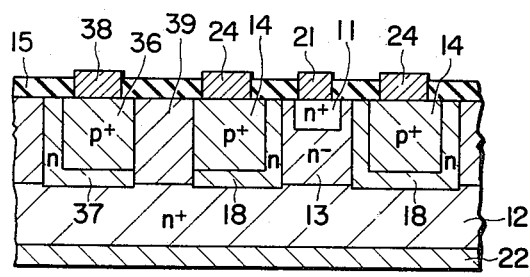
FIG. 15 is a schematic cross sectional view of an IIL unit embodying the present invention.

In FIG. 15, there is shown an example of integrated circuit embodying the present invention. In this Figure is shown a unit of IIL containing a bipolar transistor (injector) and a static induction type transistor (inverter). The bipolar transistor is comprised of a p+ type emitter region 36, an n− type base region 39, and a p+ type collector region 14. An n type region 37 is provided locally around the emitter region 36 for the prevention of unnecessary injection. The static induction type transistor includes an n+ type source region 12, a p+ type gate region 14, an n− type channel region 13, and an n+ type region 11, and around the gate region is provided an n type region 18. Reference numerals 21, 22, 24 and 38 represent electrodes, respectively. This example is similar in structure to the example of FIG. 7A, with the exception that the inverter transistor is of the upside-down type and that the n type region 18 is not formed in that portion which is adjacent to the base of the injector transistor.

It will be understood as a matter of course that various alterations and combinations of the above-stated embodiments are possible. The conductivity types, the impurity concentrations and the configurations of the respective regions may be altered depending on the purposes. The impurity concentration may be varied in gradual manner in place of forming regions of different but uniform impurity concentrations. It belongs to the field of designing to incorporate the semiconductor device of the present invention into memory, logic, analog IC, and like devices. It is also a matter of designing to incorporate the structures shown in the respective embodiments stated above into multi-channel device, or to combine such structures with other elements, or to select the semiconductor material from Si, Ge, GaAs and other compound semiconductors. Also, the method of manufacturing the semiconductor devices of the present invention can be easily thought of by those skilled in the art, and therefore the method of manufacture is not specifically limited. Explanation has been made with respect only to instances of junction gate, but the present invention may be applied equally effectively to insulated gate, Schottky gate and like structures.

As stated above, according to the static induction type semiconductor device of the present invention, it is possible to reduce the width of the channel region by arranging so that a non-uniform impurity concentration profile is provided within the channel. If an effective channel region is formed within a lower impurity concentration region, it is possible to increase the width of the effective channel and/or to reduce the total width of the channel region.

If a high impurity concentration region is provided adjacent to that portion of the effective channel region located on the other main electrode side, it is possible to reduce the transit time of carriers.

A high potential gradient in the vicinity of the gate region can be provided by either a high impurity concentration region or a low impurity concentration region located adjacent to a region having a high impurity concentration and a low potential.

If a lower impurity concentration region is provided in the vicinity of the source region, there is an advantage in that minority carriers are accumulated thereat and that majority carriers are attractively pulled out.

What is claimed is:

1. A static induction type semiconductor device formed in a semiconductor wafer having a pair of principal surfaces, comprising:
    a low resistivity source region of one conductivity type exposed at one of said principal surfaces;
    a high resistivity main channel region of said one conductivity type disposed adjacent to said source region;
    a low resistivity gate region of the other conductivity type opposite to said one conductivity type extending from said one principal surface into said semiconductor wafer and substantially surrounding said main channel region;
    a subsidiary channel region having said one conductivity type and a resistivity lower than that of said main channel region but higher than that of said source region and disposed adjacent to said main channel region and to said gate region on that side thereof facing the other one of the principal surfaces;
    a low resistivity current electrode region exposed at other one of the principal surfaces; and
    a high resistivity auxiliary region of said one conductivity type disposed between said subsidiary channel region and said current electrode region.

2. A static induction type semiconductor device formed in a semiconductor wafer having a pair of principal surfaces, comprising:
    a low resistivity source region of a first conductivity type exposed at one of said principal surfaces;
    a high resistivity main channel region of said first conductivity type disposed adjacent to said source region;
    a low resistivity gate region of a second conductivity type opposite to said first conductivity type extending from said one of the principal surfaces into said semiconductor wafer and substantially surrounding said main channel region;
    a subsidiary channel region having said first conductivity type and a resistivity lower than that of said main channel region and disposed between said main channel region and said gate region and adjacent to these two regions at a location on that side of these regions facing the other one of the principal surfaces;
    a low resistivity current electrode region exposed at other one of the principal surfaces; and
    a high resistivity auxiliary region of said first conductivity type disposed between said subsidiary channel region and said current electrode region.

3. A static induction type semiconductor device formed in a semiconductor wafer having a pair of principal surfaces, comprising:
    a low resistivity source region of a first conductivity type exposed at one of said principal surfaces;
    a high resistivity main channel region of said first conductivity type disposed adjacent to said source region;
    a low resistivity gate region of a second conductivity type opposite to said first conductivity type and recessed from said one principal surface and substantially surrounding said main channel region;
    a subsidiary channel region having said first conductivity type and a resistivity lower than that of said main channel region and disposed between said main channel region and said gate region and adjacent to these two regions at a location on that side of these regions facing the other one of the principal surfaces;
    a low resistivity current electrode region exposed at other one of the principal surfaces; and
    a high resistivity auxiliary region of said first conductivity type disposed between said subsidiary channel region and said current electrode region.

4. A static induction type semiconductor device comprising:
    first and second current electrode regions, a semiconductor channel region of one conductivity type disposed between said current electrode regions for allowing a current to flow therethrough, and a control electrode region disposed adjacent to said semiconductor channel region for developing into said channel region a depletion layer capable of controllably establishing a potential barrier for the majority carriers injected from said first current electrode region, the improvement wherein:
    said semiconductor channel region includes a main channel region of a relatively high resistivity and a subsidiary channel region of a relatively low resistivity disposed adjacent to said main channel region between said main channel region and said control electrode region, and said potential barrier is controllably established substantially in said main channel region;
    said subsidiary channel region being located between said main channel region and the second current electrode region; and
    said device further comprises a high resistivity semiconductor region of said one conductivity type located between said subsidiary semiconductor region and said second current electrode region.

* * * * *